(12) United States Patent
Li et al.

(10) Patent No.: US 12,009,270 B2
(45) Date of Patent: Jun. 11, 2024

(54) WELDING METHOD OF DEMETALLIZED CERAMIC SUBSTRATE HAVING SURFACE CAPILLARY MICROGROOVE STRUCTURE

(71) Applicants: SOUTH CHINA UNIVERSITY OF TECHNOLOGY, Guangzhou (CN); GUANGDONG LUCKYSTAR ELECTRONIC TECHNOLOGY CO., LTD, Guangdong (CN); SHENZHEN GOOD-MACHINE AUTOMATIC EQUIPMENT CO., LTD, Guangdong (CN)

(72) Inventors: Zongtao Li, Guangzhou (CN); Yong Tang, Guangzhou (CN); Hong Wang, Guangzhou (CN); Shudong Yu, Guangzhou (CN); Kejian Wu, Guangzhou (CN); Guanwei Liang, Guangzhou (CN); Xinrui Ding, Guangzhou (CN)

(73) Assignees: SOUTH CHINA UNIVERSITY OF TECHNOLOGY, Guangzhou (CN); GUANGDONG LUCKYSTAR ELECTRONIC TECHNOLOGY CO., LTD, Guangdong (CN); SHENZHEN GOOD-MACHINE AUTOMATIC EQUIPMENT CO., LTD, Guangdong (CN)

( * ) Notice: Subject to any disclaimer, the term of this patent is extended or adjusted under 35 U.S.C. 154(b) by 417 days.

(21) Appl. No.: 17/607,901

(22) PCT Filed: Nov. 14, 2019

(86) PCT No.: PCT/CN2019/118291
§ 371 (c)(1),
(2) Date: Nov. 1, 2021

(87) PCT Pub. No.: WO2020/220643
PCT Pub. Date: Nov. 5, 2020

(65) Prior Publication Data
US 2022/0293480 A1  Sep. 15, 2022

(30) Foreign Application Priority Data
Apr. 30, 2019  (CN) .......................... 201910364622.5

(51) Int. Cl.
*H01L 23/13*  (2006.01)
*H01L 23/15*  (2006.01)
*H01L 33/62*  (2010.01)

(52) U.S. Cl.
CPC .............. *H01L 23/13* (2013.01); *H01L 23/15* (2013.01); *H01L 33/62* (2013.01)

(58) Field of Classification Search
CPC ... H01L 23/13; H01L 23/15; H01L 23/49805; H01L 33/62; H01L 33/48; H01L 24/24; H01L 24/82
See application file for complete search history.

(56) References Cited

U.S. PATENT DOCUMENTS

2017/0278762 A1*  9/2017  Kessler ............. H01L 23/49816
2018/0138155 A1*  5/2018  Kim .................... H01L 25/0657

FOREIGN PATENT DOCUMENTS

| CN | 1643691 | 7/2005 |
| CN | 203103354 | 7/2013 |

(Continued)

OTHER PUBLICATIONS

"International Search Report (Form PCT/ISA/210) of PCT/CN2019/118291" mailed on Feb. 13, 2020, with English translation thereof, pp. 1-5.

*Primary Examiner* — Marc Anthony Armand
(74) *Attorney, Agent, or Firm* — JCIPRNET

(57) ABSTRACT

The present invention discloses a welding method of a demetallized ceramic substrate having a surface capillary (Continued)

microgroove structure. The demetallized ceramic substrate includes a ceramic substrate main body and surface capillary microstructures. The surface capillary microstructures are arranged on two lateral sides of the ceramic substrate main body and the surface capillary microstructures specifically are capillary microgrooves. The welding method includes the following steps: fixing a chip to an upper surface of the demetallized ceramic substrate having the surface capillary microgroove structure, fixing the ceramic substrate with the chip to a printed circuit board having a bonding pad, and placing melted solder on the bonding pad, and driving the solder to ascend to an electrode of the chip from the bonding pad in a lower layer by means of a capillary force, thereby realizing an electrical connection between the chip and the printed circuit board.

9 Claims, 3 Drawing Sheets

(56) References Cited

FOREIGN PATENT DOCUMENTS

| CN | 108962846 | 12/2018 |
|---|---|---|
| CN | 109059592 | 12/2018 |
| CN | 110137141 | 8/2019 |
| CN | 209766404 | 12/2019 |
| WO | 2014171890 | 10/2014 |

\* cited by examiner

WELDING METHOD OF DEMETALLIZED CERAMIC SUBSTRATE HAVING SURFACE CAPILLARY MICROGROOVE STRUCTURE

CROSS-REFERENCE TO RELATED APPLICATION

This application is a 371 of international application of PCT application serial no. PCT/CN2019/118291, filed on Nov. 14, 2019, which claims the priority benefit of China application no. 201910364622.5, filed on Apr. 30, 2019. The entirety of each of the above mentioned patent applications is hereby incorporated by reference herein and made a part of this specification.

TECHNICAL FIELD

The present invention belongs to the technical field of microelectronic packaging, and specifically discloses a welding method of a demetallized ceramic substrate having a surface capillary microgroove structure.

BACKGROUND

The ceramic substrate is a flaky material that forms a supporting base for a membrane circuit component and an external pasting component by taking an electronic ceramic as a substrate. The ceramic substrate has excellent heat conductivity and airtightness, and is widely applied to the fields of power electronics, LED packaging and the like.

The ceramic substrate as an LED chip substrate is a medium through which heat energy between an LED chip and a system circuit board can be exported, and the ceramic substrate is combined with the LED chip by means of an eutectic mode or a flip chip mode, thereby playing a role of supporting and protecting the chip simultaneously. In order to ensure the heat dissipating stability and the luminous efficiency of the LED, the heat-dissipating ceramic substrate in the market mainly includes the following four types: a multilayered low-temperature co-fired ceramic (LTCC), a multilayered high-temperature co-fired ceramic (HTCC), a direct bonding copper substrate (DBC) and a direct plate copper substrate (DPC). A metalizing process cannot be avoided in existing ceramic substrate production processes, and in particular, when a flip chip is adopted, it is needed to plate copper to the upper surface (the surface where the chip is placed) of the ceramic substrate and plate an electrode on the lower surface, and meanwhile, a metalized via hole is further needed. Thus, the production process of the ceramic substrate is complex and the cost is very high.

SUMMARY

In order to overcome defects in the prior art, the objective of the present invention is to provide a demetallized ceramic substrate having a surface capillary microgroove structure and a welding method thereof.

Aiming at the abovementioned problem, the present invention provides a demetallized ceramic substrate having a surface capillary microgroove structure and a welding method thereof. The present invention has the advantages of being simple in structure and process, capable of providing a reliable electrical connection between the chip and the printed circuit board and the like.

The objective of the present invention is at least realized by one of the technical schemes as follows:

the demetallized ceramic substrate having a surface capillary microgroove structure provided by the present invention includes a ceramic substrate main body and surface capillary microstructures, the surface capillary microstructures being capillary microgrooves.

Further, the surface capillary microstructures are two capillary microgrooves in left-right symmetry, the two capillary microgrooves being respectively formed in two lateral sides of the ceramic substrate main body and not being communicated with each other; and the capillary microgrooves are formed by etching the ceramic substrate main body inwards from an upper surface and from lateral side surfaces.

Further, shapes of the capillary microgrooves include rectangular microgrooves, zigzag microgrooves and round microgrooves, but not limited to the above several types.

Further, modes of preparing the capillary microgrooves include laser machining, photoetching and chemical etching.

Further, a mean width of the capillary microgrooves is 10-100 μm, and a mean groove depth thereof is 10-100 μm, so that a small enough linearity is formed to meet a requirement on a force of a capillary driven solder.

Further, a material of the ceramic substrate main body includes $Al_2O_3$, BeO and AlN. Further, the ceramic substrate is formed by sintering one of $Al_2O_3$, BeO and AlN at a high temperature.

Preferably, the ceramic substrate main body is prepared by adopting a method of sintering a ceramic chip, herein a sintering temperature is 850-1900° C. A method for forming the ceramic substrate includes powder compacting, casting and rolling.

A welding method for a demetallized ceramic substrate having a surface capillary microgroove structure provided by the present invention includes the following steps:

Step (1) fixing (die bond) a chip to an upper surface of a demetallized ceramic substrate having a surface capillary microgroove structure;

Step (2) fixing the ceramic substrate with the chip to a printed circuit board having a bonding pad in suitable position; and Step (3) placing a melted solder on the bonding pad, and driving the solder to ascend to an electrode of the chip from the bonding pad in a lower layer by means of a capillary force, thereby realizing an electrical connection between the chip and the printed circuit board.

Further, the fixing in the step (1) includes fixing by insulated glue.

Further, the fixing in the step (2) includes fixing by insulated glue or mechanical clamping.

Further, the melted solder in the step (3) includes a gold and tin eutectic solder, a melting point of the gold and tin eutectic solder being 217-230° C. and a gold content thereof being 10-15 wt %; and a welding mode includes reflow soldering, an equipment power of the reflow soldering being 11-15 kW, a length of a heating zone being 1000-2000 mm and a heating temperature being 220-240° C.

Compared with the prior art, the present invention has the advantages and effects that (1) according to the demetallized ceramic substrate having a surface capillary microgroove structure provided by the present invention, the ceramic substrate is simple in structure and manufacturing process, and processes of copper plating, photoetching, electrode evaporating and the like are canceled, so that the production difficulty of previously metalizing the ceramic substrate is lowered greatly, and the ceramic substrate fits batch production.

(2) according to a welding method for the demetallized ceramic substrate having a surface capillary microgroove structure provided by the present invention, the gold-tin eutectic solder is driven by the capillary force to ascend by means of the reflow soldering method, so that the welding difficulty of previously metalizing the ceramic substrate is reduced, the process flow is simplified greatly, and the production cost is lowered to the maximum extent while a reliable connection is guaranteed.

1, ceramic substrate main body; 2, surface capillary microstructure; 3, chip; 4, printed circuit board; 5, bonding pad; 6, melted solder.

DETAILED DESCRIPTION

Further description of specific embodiments of the present invention in detail will be made below in combination with drawings and examples, but implementation and protection of the present invention are not limited thereto. It should be noted that processes that are not described in detail particularly below are realized or understood by those skilled in the field with reference to prior art. The used reagents or instruments not indicated by manufacturers are conventional products which can be purchased in the market.

Example 1

Figure 1:
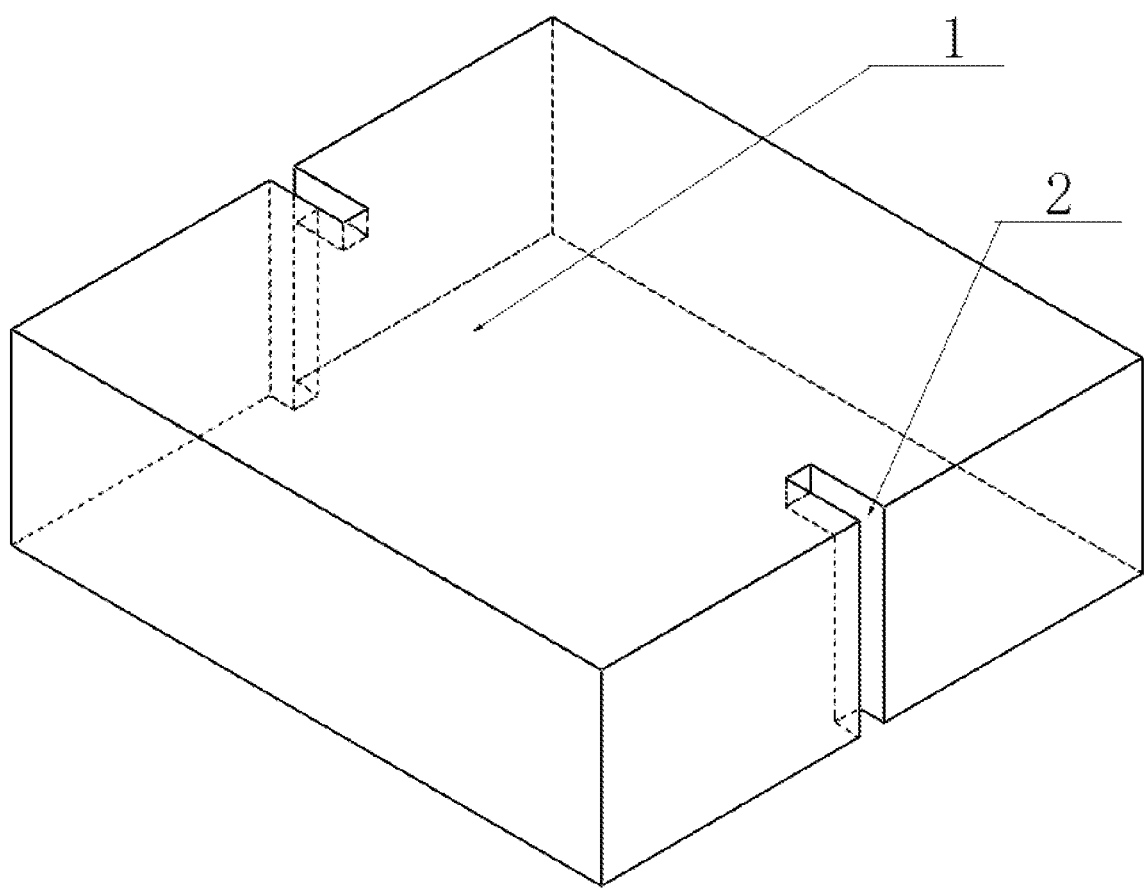
FIG. 1 is a schematic diagram of a demetallized ceramic substrate with rectangular capillary structures (a demetallized ceramic substrate having a surface capillary microgroove structure).

A demetallized ceramic substrate having a surface capillary microgroove structure includes a ceramic substrate main body 1 and surface capillary microstructures 2, the surface capillary microstructures 2 being arranged on two lateral sides of the ceramic substrate main body 1 and the surface capillary microstructures specifically being capillary microgrooves. The structure of the demetallized ceramic substrate having the surface capillary microgroove structure is seen in FIG. 1.

The surface capillary microstructures are two capillary microgrooves in left-right symmetry, the two capillary microgrooves being respectively formed in two lateral sides of the ceramic substrate main body and not being communicated with each other; and the capillary microgrooves are formed by etching the ceramic substrate main body inwards from an upper surface and from lateral side surfaces. The capillary microgrooves include rectangular microgrooves, zigzag microgrooves and round microgrooves.

The material of the ceramic substrate main body is AlN, and is formed by sintering the AlN material at 1500 degrees centigrade. Two photoresists not contacted with each other are coated to the upper surface and the two lateral side surfaces of the sintered ceramic substrate main body according to the shape and position of the electrode of the chip, herein an interval distance is 25 μm and a thickness of the photoresist is 2 sm. Exploded development is carried out by means of ultraviolet rays to obtain the rectangular capillary microgrooves that are 10 μm wide and 10 μm long, thereby obtaining the demetallized ceramic substrate having the surface capillary microgroove structure.

Figure 2:
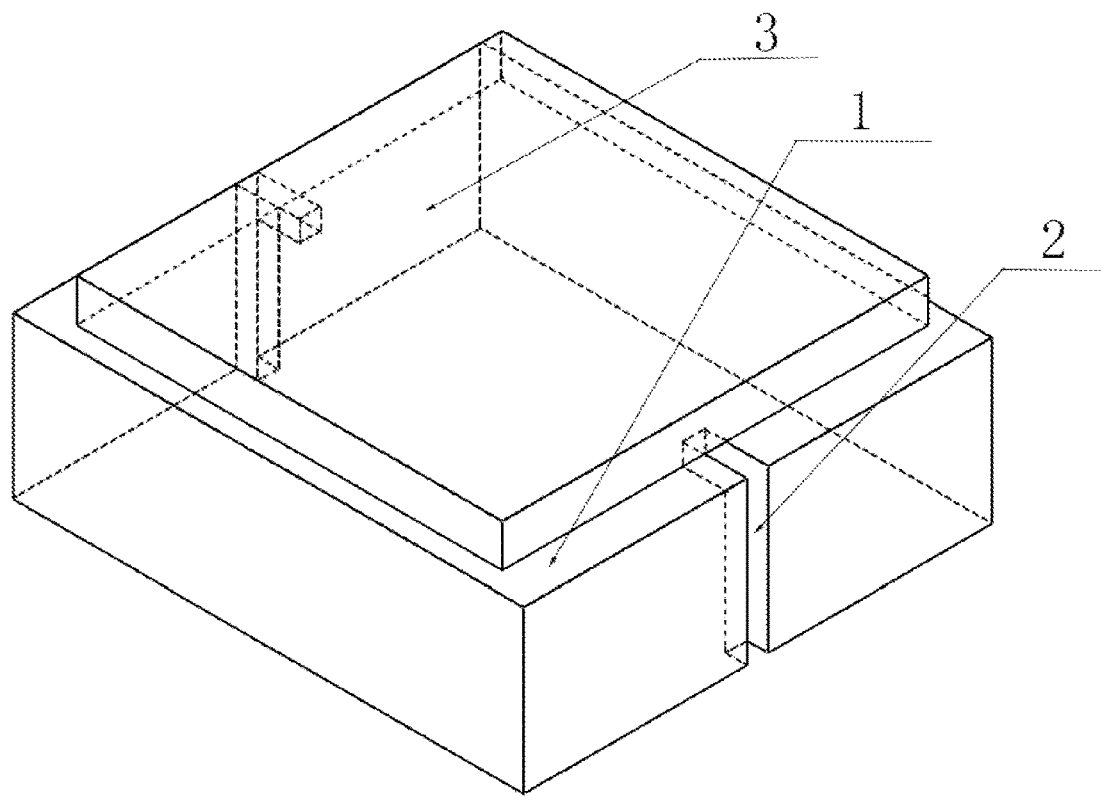
FIG. 2 is a schematic diagram of a demetallized ceramic substrate with rectangular capillary microgroove structures where an LED chip is placed.
Figure 3:
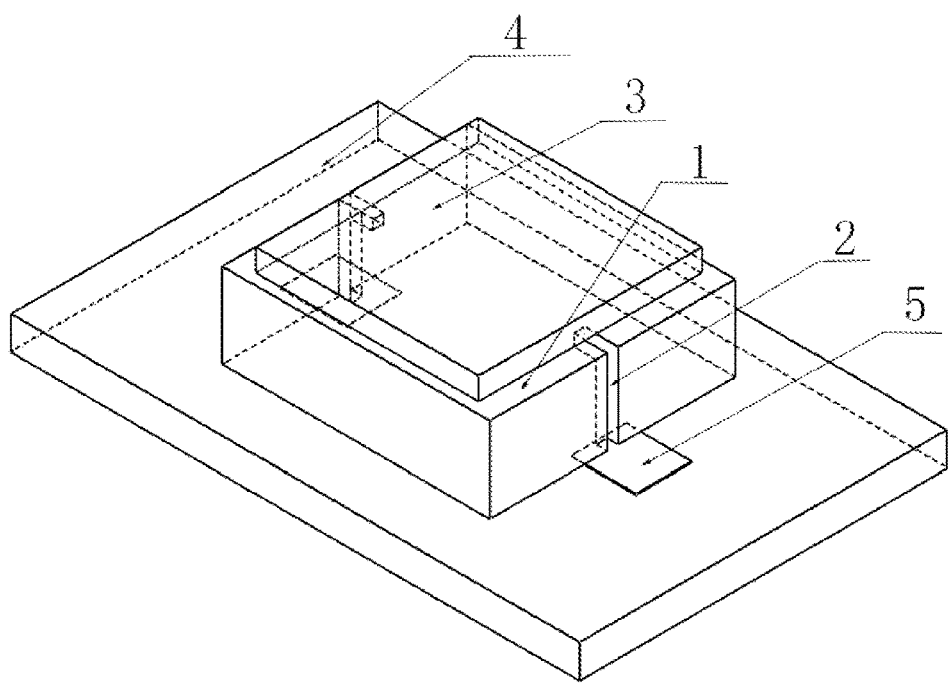
FIG. 3 is a schematic diagram of welding a demetallized ceramic substrate having rectangular capillary microgroove structures to a printed circuit board.

A welding method for a demetallized ceramic substrate having a surface capillary microgroove structure includes the following steps:
(1) a chip 3 was fixed to an upper surface of a demetallized ceramic substrate having a surface capillary microgroove structure (the chip was fixed by DX-20 model insulated glue), as shown in FIG. 2;
(2) the ceramic substrate with the chip was fixed to a printed circuit board 4 having a bonding pad (the ceramic substrate was fixed by DX-20 model insulated glue), as shown in FIG. 3; and
(3) the melted solder 6 was placed on the bonding pad 5, the solder was driven by a capillary force to ascend to the electrode of the chip from the bonding pad in the lower layer, a 11 kw reflow soldering device was adopted, a gold-tin eutectic solder with a melting point of 217° C. was placed on the printed circuit board and was heated to 230° C. within a time of 3s to smelt the solder, and driven by the capillary force, the solder flowed to the electrode of the chip, so that the electrical connection between the chip and the printed circuit board was realized, thereby completing a welding process.

Figure 4:
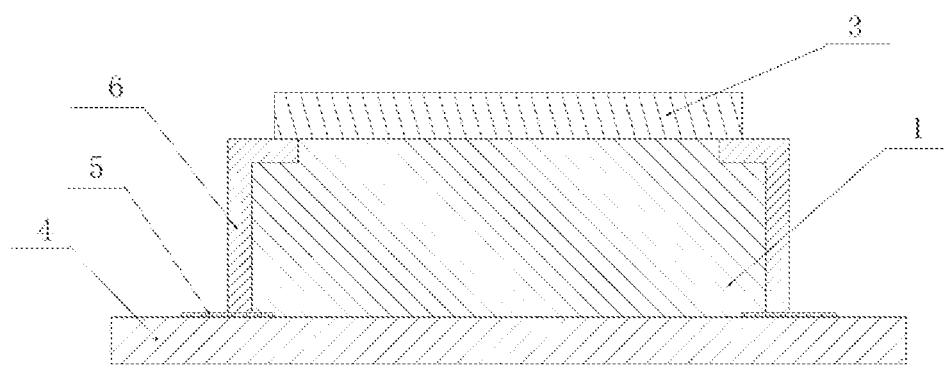
FIG. 4 is a section view of welding a demetallized ceramic substrate having rectangular capillary microgroove structures to a printed circuit board.

A solder was coated to the bonding pad of the printed circuit board in the lower layer in the embodiment 1. By adopting the reflow soldering method, a melted solder drop driven by the capillary force flowed to the electrode of the LED chip and was connected with the electrode of the LED chip so as to form the demetallized ceramic substrate that has a protecting and heat dissipating function and can provide the reliable electrical connection, as shown in FIG. 4. Through test, a welding strength meets a normal using requirement of an LED lamp. On the premise of guaranteeing the reliable electrical performance, the production time of the whole production flow is shorter than 1 min, so that the production time is shortened greatly and the production cost is saved.

The above embodiments are merely preferred embodiments of the present invention and are merely used for explaining the present invention rather than limiting the present invention. Variations, substitutions and modifications made by those skilled in the field shall fall within the scope of protection of the present invention without departing from the spirit of the present invention.

What is claimed is:

1. A welding method of a demetallized ceramic substrate having a surface capillary microgroove structure, the demetallized ceramic substrate comprising a ceramic substrate main body and surface capillary microstructures, the surface capillary microstructures being arranged on two lateral sides of the ceramic substrate main body and the surface capillary microstructures specifically being capillary microgrooves, the welding method comprises the following steps:
Step (1) fixing a chip to an upper surface of the demetallized ceramic substrate having the surface capillary microgroove structure;
Step (2) fixing the demetallized ceramic substrate with the chip to a printed circuit board having a bonding pad; and Step (3) placing melted solder on the bonding pad, and driving the melted solder to ascend to an electrode of the chip from the bonding pad in a lower layer by means of a capillary force, thereby realizing an electrical connection between the chip and the printed circuit board.

2. The welding method of the demetallized ceramic substrate having the surface capillary microgroove structure according to claim 1, wherein the surface capillary microstructures are two capillary microgrooves in mirror symmetry, the two capillary microgrooves being respectively formed in two lateral sides of the ceramic substrate main body and not being communicated with each other; and the capillary microgrooves are formed by etching the ceramic substrate main body inwards from an upper surface and from lateral side surfaces.

3. The welding method of the demetallized ceramic substrate having the surface capillary microgroove structure according to claim 1, wherein the capillary microgrooves comprise rectangular microgrooves, zigzag microgrooves and round microgrooves.

4. The welding method of the demetallized ceramic substrate having the surface capillary microgroove structure according to claim 1, wherein modes of preparing the capillary microgrooves comprise laser machining, photo-etching and chemical etching.

5. The welding method of the demetallized ceramic substrate having the surface capillary microgroove structure according to claim 1, wherein a mean width of the capillary microgrooves is 10-100 μm, and a mean groove depth thereof is 10-100 μm.

6. The welding method of the demetallized ceramic substrate having the surface capillary microgroove structure according to claim 1, wherein a material of the ceramic substrate main body comprises $Al_2O_3$, BeO and AlN.

7. The welding method of the demetallized ceramic substrate having the surface capillary microgroove structure according to claim 1, wherein the fixing in the step (1) comprises fixing by insulated glue.

8. The welding method of the demetallized ceramic substrate having the surface capillary microgroove structure according to claim 1, wherein the fixing in the step (2) comprises fixing by insulated glue or mechanical clamping.

9. The welding method of the demetallized ceramic substrate having the surface capillary microgroove structure according to claim 1, wherein the melted solder in the step (3) comprises a gold and tin eutectic solder, a melting point of the gold and tin eutectic solder being 217-230° C. and a gold content thereof being 10-15 wt %; and a welding mode comprises reflow soldering, an equipment power of the reflow soldering being 11-15 kW, a length of a heating zone being 1000-2000 mm and a heating temperature being 220-240° C.

* * * * *